(12) United States Patent
Feiweier

(10) Patent No.: US 10,557,909 B2
(45) Date of Patent: Feb. 11, 2020

(54) METHOD AND MAGNETIC RESONANCE TOMOGRAPHY APPARATUS FOR DIFFUSION IMAGING

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/171,611

(22) Filed: Oct. 26, 2018

(65) Prior Publication Data

US 2019/0128987 A1    May 2, 2019

(30) Foreign Application Priority Data

Oct. 27, 2017 (DE) ........................ 10 2017 219 382

(51) Int. Cl.
  *G01R 33/563* (2006.01)
  *G01R 33/561* (2006.01)
  *G01R 33/54* (2006.01)

(52) U.S. Cl.
  CPC ..... *G01R 33/56341* (2013.01); *G01R 33/543* (2013.01); *G01R 33/5618* (2013.01)

(58) Field of Classification Search
  None
  See application file for complete search history.

(56) References Cited

U.S. PATENT DOCUMENTS

| | | |
|---|---|---|
| 2010/0277169 A1 | 11/2010 | Feiweier |
| 2013/0063144 A1 | 3/2013 | Feiweier |
| 2017/0131376 A1* | 5/2017 | Miyazaki ......... G01R 33/56308 |

OTHER PUBLICATIONS

Morelli, et al: "Evaluation of a Modified Stejskal-Tanner Diffusion Encoding Scheme, Permitting a Marked Reduction in TE, in Diffusion-Weighted Imaging of Stroke Patients at 3 T", Investigative Radiology ? vol. 45, No. 1, pp. 29-35, (2010).
Stejskal, et al; "Spin Diffusion Measurements: Spin Echoes in the Presence of a Time-Dependent Field Gradient"; The Journal of Chemical Physics; vol. 42, No. 1,1 pp. 288-292; (1965).

* cited by examiner

*Primary Examiner* — Jermele M Hollington
(74) *Attorney, Agent, or Firm* — Schiff Hardin LLP

(57) ABSTRACT

In a method and magnetic resonance tomography apparatus for diffusion imaging, coherences are determined in a processor, which would occur during the diffusion imaging measurement, and an implicit spoil moment $M_A$ resulting from a diffusion gradient pulse is determined in the processor. A spoiler moment $M_S$ is established in the processor as a function of a comparison value and threshold value formed from the implicit spoil moment $M_A$ and the suppression moment M. Depending on whether this comparison value lies below or above the threshold value, different calculation techniques are applied for the spoiler moment $M_S$. Diffusion gradient pulses and spoiler gradient pulses in accordance with the moments $M_A$ and $M_S$ in a pulse sequence for operating the magnetic resonance tomography apparatus.

18 Claims, 4 Drawing Sheets

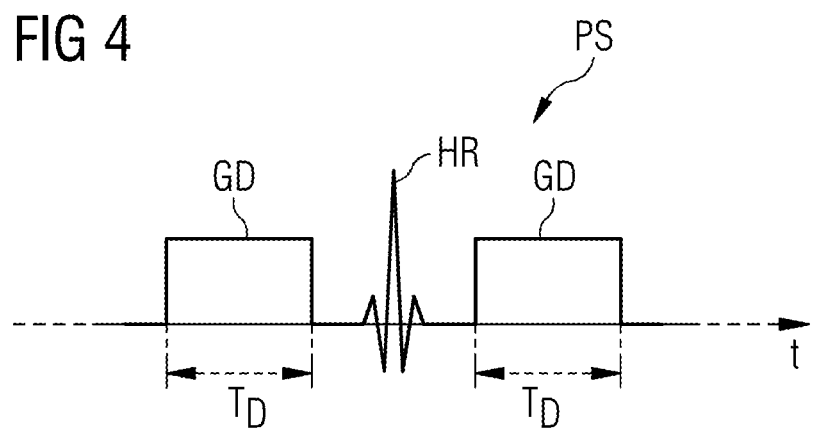
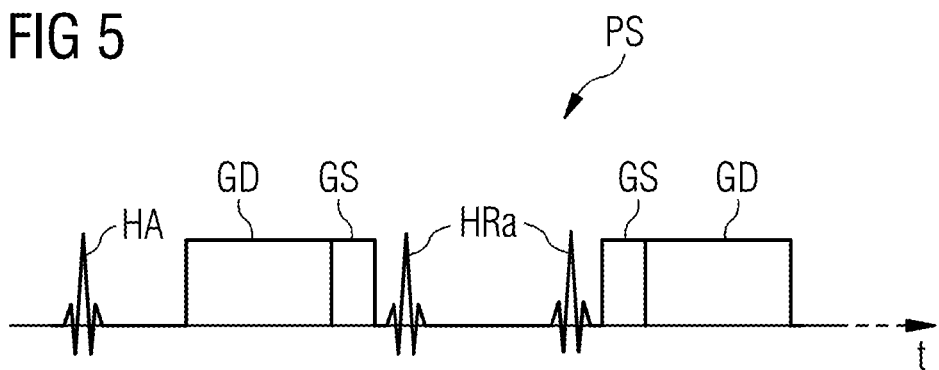

METHOD AND MAGNETIC RESONANCE TOMOGRAPHY APPARATUS FOR DIFFUSION IMAGING

BACKGROUND OF THE INVENTION

Field of the Invention

The present invention concerns a method for controlling a magnetic resonance tomography (MRT) apparatus for diffusion imaging, in particular for showing the Intra-Voxel Incoherent Motion (IVIM), wherein an adaptation of spoiler gradient pulses takes place. The invention also concerns a spoiler gradient pulse adaptation processor, a control computer relating thereto and a magnetic resonance tomography apparatus controlled accordingly.

Description of the Prior Art

In magnetic resonance imaging, image data representing anatomy or physiology within the examination object, and/or parameter maps relating thereto, are created by the operation of a magnetic resonance tomography apparatus. Parameter maps reproduce a spatial or temporal distribution of specific parameter values within the examination object, with which it is readily possible to create image data again from parameter maps.

Diffusion-weighted magnetic resonance recordings are magnetic resonance recordings with which the diffusion movement of specific substances, in particular of water molecules, in body tissue can be measured and depicted spatially resolved. Diffusion imaging has become established in everyday clinical practice, in particular in the diagnosis of strokes, since the regions of the brain involved are already able to be recognized at a much earlier stage in diffusion-weighted images than in classical magnetic resonance recordings. In addition, diffusion imaging is being employed to an increasing extent in the fields of oncological, cardiological and musculoskeletal disorders. A variant of diffusion-weighted magnetic resonance tomography is diffusion tensor imaging, in which the direction dependency of the diffusion is also detected. The term "diffusion-weighted magnetic resonance recordings" as used herein encompass both magnetic resonance recordings created within the framework of diffusion-weighted magnetic resonance tomography and magnetic resonance recordings created within the framework of diffusion tensor imaging or within the framework of complex models such as modeling of higher-order tensors, multi-component models, spherical deconvolution, and others.

For the creation of diffusion-weighted magnetic resonance recordings, diffusion-encoded raw data must first be acquired. This is done by operating an MR scanner with special diffusion gradient measurement sequences, which are also referred to below as "pulse sequences". These measurement sequences are characterized by, after the usual deflection of the nuclear spins in a plane transverse to the basic magnetic field of the magnetic resonance scanner, a specific sequence of gradient magnetic field pulses (diffusion gradient pulses) is applied, which vary the field strength of the external magnetic field in a predetermined direction. If a diffusion movement is present, the precessing nuclei fall out of phase, which makes itself noticeable in the measurement signal.

Gradient pulses always have an amplitude, which is usually constant, but can also vary over time. Often the amplitudes consist of ramps with constant sections therebetween. The time duration of a gradient pulse is referred to below as the "application time".

Generally in diffusion imaging, a number of images with different diffusion directions and weightings, i.e. with different diffusion gradient pulses, are recorded and combined with one another. The strength of the diffusion weighting is defined by the so-called diffusion weighting factor, also called the b value. The b value is computed in a model, using the idealized assumption of perfectly rectangular diffusion gradient pulses, from the gyromagnetic ratio $\gamma$ ($2.675*10^8$ T/s) and the amplitude G, the activation time $\tau$ and time interval $\Delta$ of the gradients relevant for diffusion encoding in accordance with $$b = \gamma^2 G^2 \tau^2 \left(\Delta - \frac{\tau}{3}\right). \tag{1}$$

If for example the amplitude G is doubled, then the effective time $T=\Delta-\tau/3$ is able to be reduced to a quarter, assuming that the activation time $\tau$ remains unchanged, if the b value is to remain the same. The expression "a quarter" applies approximately for the case in which the value of the time interval of the diffusion gradients $\Delta$ is large compared to the value of the activation time $\tau$.

The different diffusion images or the images or parameter maps combined from them can be used for the desired diagnostic purposes. In order to be able to correctly estimate the influence of the diffusion movement, a further reference recording is used in many cases for comparison, in which no diffusion gradient pulse is applied, i.e. an image with b=0. The pulse measurement sequence for acquisition of the reference raw data is structured in the same way as the diffusion gradient measurement sequence with the exception of the emission of the gradient pulses. As an alternative a reference recording can be carried out with a b value≠0.

In MR diffusion imaging, images or parameter maps are used for the diagnostics, in which a free diffusion process, also referred to as a free normal Gaussian diffusion process, with an apparent diffusion coefficient (ADC) is assumed. This process is characterized by, depending on the diffusion-weighting factor, the signal strength reducing in accordance with an exponential relationship.

Expansions of this model take account, for example, of the direction dependency of the diffusion in microscopically restricted geometries: For example, water molecules can move more quickly along nerve fibers than transversely thereto. The diffusion tensor model captures these relationships while still assuming a (now) direction-dependent free normal Gaussian diffusion process, and allows the computation and display of associated parameters or parameter values, such as parameters relating to the direction anisotropy.

Over and above this, a series of further approaches are known, with which deviations from Gaussian behavior can be described with corresponding model functions. These include, for example, the IVIM model (IVIM=Intra-Voxel Incoherent Motion), in which the starting point is a bi-exponential drop in the signal amplitude as a function of the b value as a result of perfusion effects. This class of approaches also includes the Kurtosis model, in which deviations from the exponential dependency of the signal strength from the b value are modeled with higher-order tensors.

The IVIM model describes a method for quantitatively determining microscopic translation movements, which can contribute to signals within the framework of the diffusion imaging. In biological tissue these movements are essentially the molecular diffusion of water and the microcirculation of blood in the capillary network (perfusion). The concept introduced by D. Le Bihan within the framework of IVIM is that water that is flowing in randomly oriented capillaries (at the voxel level), imitates a random diffusion ("pseudodiffusion"). It is responsible for a signal attenuation in the diffusion imaging, which depends on the speed of the flowing blood in the vessel architecture. In a similar way to molecular diffusion, the effect of the pseudodiffusion depends on the signal attenuation from the b value. The rate of the signal attenuation, which is produced by the pseudodiffusion, is however typically greater by an order of magnitude that the molecular diffusion in the tissues, so that its relative contribution to the diffusion-weighted MRT signal only becomes significant at very low b values, whereby diffusion and perfusion effects can be separated.

To determine the IVIM, it is necessary to record a number of diffusion-weighted measurements with different weightings (b values). Usually a larger number of small b values of up to ~100 s/mm² are needed, as well as a further number of larger b values ranging from a few hundred to a thousand s/mm².

It is precisely with small b values that the problem occurs of the moments of the diffusion gradients necessary for realization being so small that unwanted coherence paths will no longer be suppressed. With diffusion measurements using a spin echo method, two RF pulses are used, namely one RF excitation pulse and one RF refocusing pulse. These generate the desired spin echo coherence path and two unwanted FID coherence paths (FID=Free Induction Decay). Other methods use three RF pulses for example (twice refocused spin echo, stimulated echo) and generate a larger number of unwanted paths. In order to avoid interference artifacts it is necessary to suppress the contributions of all unwanted signal paths sufficiently strongly. Where this suppression is not achieved by the diffusion gradients themselves, additional spoiler gradient pluses must be applied. However the latter can lead to small b values not being able to be realized and/or larger deviations occurring between desired and actual b values.

SUMMARY OF THE INVENTION

An object of the present invention is to provide a method for control as well as a corresponding spoiler gradient pulse adaptation processor and a control computer, with which an improved control of a magnetic resonance tomography apparatus for diffusion imaging is achieved. In particular an object of the invention is to realize as large a range of b values as possible as precisely as possible, wherein despite this, unwanted coherence paths are still suppressed sufficiently strongly.

The inventive method for control of a magnetic resonance tomography apparatus for diffusion imaging, which is suitable in particular for displaying Intra-Voxel Incoherent Motion (IVIM), has by the following steps:

Determination of coherences.

In this step coherences that would occur during a measurement are determined. In addition a suppression moment M needed for suppression of these coherences is determined. A coherence is a state of an ensemble of magnetizations, which is able to be converted with suitable measures, e.g. with the application of gradients, to a measurable echo signal, i.e. to an almost synchronous precession. As an alternative to the term "coherence" the term "signal path" can also be used.

The basic techniques and formulas for determination of coherences are known to the person skilled in the art. The suppression moment M needed for suppression of these coherences is produced e.g. from the read-out gradients GR and a previously-known factor F>0, preferably F≥1, by means of the formula $$M > F |\int GR(t)dt|. \qquad (2)$$

In the simplest case, for recording with a previously-known field of view (FOV) and a previously-known number of pixels PX per row, the following applies in this case:

$$M = F \frac{2\pi}{\gamma} \frac{PX}{FOV}. \qquad (3)$$

The result achieved with this suppression moment is that pixels within a voxel experience a relative dephasing of F 2π.

Determination of an implicit spoil moment $M_A$.

By application of a predetermined diffusion gradient pulse with the amplitude $A_D$ (as a rule dependent on the time) and a specific application time $T_D$ (in conjunction with a predetermined diffusion encoding for a pulse sequence or a spin echo sequence) a specific moment acts automatically, which is referred to as an "implicit spoil moment" $M_A$. In practice at least two diffusion gradient pulses are mostly applied, wherein in this case the spoil moments of the two diffusion gradient pulses are to be taken into account. In an ideal case, in which the amplitude $A_D$ is constant and rise and fall are negligible, the implicit spoil moment is calculated as $M_A = A_D \cdot T_D$. In general the implicit spoil moment $M_A$ is calculated in accordance with $$M_A = \int_0^{T_A} A_D(t)dt. \qquad (4)$$

In this case it is of advantage to take account of the diffusion direction and diffusion weighting, i.e. of the part amplitude with which the diffusion gradient pulse is divided between the gradient axes. This should be employed independently for each diffusion encoding required in the measurement, i.e. for each direction and each weighting. With a division of the diffusion gradient pulses (GD) on a number of axes with the partial moments $M_{Ax}$, $M_{Ay}$, $M_{Az}$ on the axes X, Y and Z, an effective implicit spoil moment $M_A$ is calculated for example in accordance with:

$$M_A = \sqrt{\frac{1}{3}(M_{A_x}^2 + M_{A_y}^2 + M_{A_z}^2)}. \qquad (5)$$

Establishment of a spoiler moment.

The spoiler moment $M_S$ is calculated depending on a comparison value formed from the implicit spoil moment $M_A$ and the suppression moment M and a threshold value. Depending on whether this comparison value lies below or above the threshold value, different ways of calculating the spoiler moment $M_S$ are selected. In order to better differentiate it from the implicit spoil moment below, the spoiler moment is also referred to as the "(explicit) spoiler moment".

Determination of the spoiler gradient pulse.

In this step the amplitude $A_S$ and application time $T_S$ of the spoiler gradient pulse (or of the spoiler gradient pulses) are calculated from the previously determined spoiler moment $M_S$. In an idealized example case, in which the amplitude $A_S$ is defined by the type of construction of the MRT and is constant and rise and fall are negligible, the spoiler application time is calculated from $T_S=M_S/A_S$.

In general, again in accordance with the formula (4), the following applies in this case:

$$M_S=\int_0^{T_A} A_S(t)dt. \qquad (6)$$

For trapezoidal gradients the ramp duration is usually predetermined, e.g. by the gradient rise time able to be achieved by the system, so that $A_S(t)=A_S A(t)$ with a realizable maximum (constant) amplitude $A_S$ and a normalized gradient pulse form $A(t)$. The pulse can also have another form (e.g. sinusoidal ramps, etc.). For calculation of the spoiler application time the formula would merely have to be resolved in accordance with $T_S$.

Even if constant diffusion or spoiler gradient pulses are often considered in the examples given above and below, these are not constant as a rule. Even with basically constant pulses, in practice there will almost always be a rising and a falling flank present.

Formation of the pulse sequence.

This comprises the application of diffusion gradient pulses and spoiler gradient pulses, provided these have contributions not equal to zero, with the corresponding application times in the pulse sequence for the magnetic resonance tomography system. The spoiler gradient pulses in this case realize a moment, which is designed to suppress coherences occurring in the measurement, provided these have not already been suppressed by the implicit spoil moments of the diffusion gradient pulses. The simplest type of application is a predetermined division of the gradient pulses on the gradient axes of the magnetic resonance tomography system and modulation of the current flow through the gradient coils in accordance with the gradient pulse present.

An inventive spoiler gradient pulse adaptation processor has the following components:

a) A determination unit, which is designed for determination of an implicit spoil moment from a diffusion gradient pulse and its application time. As a rule in this case implicit spoil moments of a number of diffusion gradient pulses are determined.

b) A determination unit, which is designed for determination of a suppression moment for suppression of coherences that would occur during a measurement.

c) An establishment unit, which is designed to establish a spoiler moment as a function of a comparison value from the implicit spoiler moment and the suppression moment, wherein different ways of calculating the spoiler moment are employed, depending on whether this comparison value lies below or above a preset threshold.

d) A determination unit, which is designed for determination of the amplitude $A_S$ of a spoiler gradient pulse and its application time $T_S$ from the previously determined spoiler moment.

An inventive control computer for control of the magnetic resonance tomography apparatus is designed to carry out the inventive method and/or includes an inventive spoiler gradient pulse adaptation processor.

An inventive magnetic resonance tomography apparatus has an MR scanner operated by the inventive control computer.

A large part of the aforementioned components, in particular the control computer or the spoiler gradient pulse adaptation processor, can be realized entirely or in part in the form of software modules in a processor of a corresponding control device or of a processing system. A largely software-based realization has the advantage that even control devices or processing systems already used previously can be upgraded in a simple manner by a software update, in order to work in the inventive way.

The present invention therefore also encompasses a non-transitory, computer-readable data storage medium encoded with programming instructions that, when the storage medium is loaded into a computer or a spoiler gradient pulse adaptation processor, cause the computer or processor to implement any or all embodiments of the method according to the invention, as described above.

Preferably the spoiler gradient pulses are designed in relation to their direction so that they support the implicit spoil moment of the diffusion gradient pulses. Basically the spoiler gradient pulses can be divided in any given way on the gradient axes and thus the resulting moment can be aligned independently from the implicit spoil moment. The aforementioned support, i.e. an orientation of the spoiler moment according to the implicit spoil moment, is preferable, however.

As stated above, the diffusion gradients generate the implicit spoil moment. When the current diffusion direction requires the switching of gradients on a number of physical axes, and also the spoil moments (for optimum utilization of the gradient system) are to be applied on a number of axes, then in the sense of this preferred form of embodiment, the spoil leading sign for each gradient axis should be selected so that the (explicit) spoiler moment acts in the same direction as the implicit spoil moment.

Preferably the spoiler gradient pulses are realized or applied on a number of physical gradient axes. In this way the available power of the gradient system is used in the optimum way, and the (explicit) spoiler moment can be realized in the shortest possible time. Thus a maximum spoil amplitude is achieved on all physical axes for minimizing the spoil application time. In this case the correct leading sign for the partial gradient pulse should naturally be selected for each axis.

As an alternative or in addition, the spoiler gradient pulses are preferably applied with the same axis distribution as the current diffusion gradient pulses. In this way the diffusion direction is not changed by a spoiler gradient pulse, which with anisotropic diffusion processes (preferred direction, for example along nerve fibers) leads to a truer mapping of diffusion parameters. Thus the (explicit) spoiler moment acts in the same direction as the implicit spoil moment (i.e. same direction characteristic of spoiler and diffusion gradient pulses). Here as well, the correct leading sign should naturally be selected for the partial gradient pulse for each axis.

In an embodiment of the inventive method,

A comparison value is established by a comparison of the contributions of the implicit spoil moment $M_A$ and of the suppression moment M needed, preferably from the difference $M_D=M-M_A$ between implicit spoil moment $M_A$ and suppression moment M needed or a value derived from this difference $M_D$, The threshold is reached when $M=M_A$ or $M_D=0$ The spoiler moment $M_S$, in the event of $M_A<M$, is preferably defined as the difference $M_D$ or as a value derived from this difference $M_D$, and The spoiler moment $M_S$, in the event of $M_A \geq M$, is preferably zero, i.e. no spoiler gradient pulses are applied in the pulse sequence.

In another embodiment of the inventive method,
Starting from the temporal sequence of the gradient pulses, a threshold of the b value is determined, with which an implicit spoil moment $M_A$=M is reached,
A current b value is established,
A spoiler moment $M_S$, in the event of the b value lying below the threshold, e.g. 5 s/mm² or 26 m/mm², is defined so that it suppresses coherences occurring during the measurement, and
The spoiler moment $M_S$, in the event of the b value lying above or at the threshold, is preferably zero, i.e. no spoiler gradient pulses are applied in the pulse sequence.

Preferably the pulse sequence features an RF excitation pulse and an RF refocusing pulse. As a rule the RF excitation pulse is a radio-frequency pulse ("RF pulse"), which turns the spin direction by 90° in space. The RF refocusing pulse is preferably a radio-frequency pulse, which is formed by a single 180° pulse (spin echo sequence; the spins are turned by 180° in space) or represents a group of two 90° pulses (stimulated echo sequence; the spins are turned twice, by 90° each time, in space). In this case a spoiler gradient pulse is applied in each case (directly) before and (directly) after the RF refocusing pulse. In this sense "directly" means that no further gradient pulse is applied between spoiler gradient pulse and RF refocusing pulse. In the case of the group of two 90° pulses, in this regard, no diffusion gradient pulses are applied between these two RF pulses. Placing the term "directly" in brackets implies that this represents a preferred form of embodiment. In accordance with a further form of embodiment, it is preferable for another application case for slice selection gradient pulses to be applied in parallel to the RF pulses (spin echo "SE" and stimulated echo "STE") and if necessary for slice prephasing and rephasing gradient pulses to be applied directly before the slice selection gradient pulses (in particular for STE) and/or for additional spoiler gradients for suppression of further unwanted signal paths to be applied between the 90° pulses (only STE).

Preferably the time interval between the diffusion gradients relative to the RF refocusing pulse is set as constant, independently of the spoiler gradients. To do this, it is preferably established at the beginning of a measurement, in particular taking into account all b values and the direction to be recorded, how long the maximum duration for the spoiler gradient pulse can be. This time interval would be kept between the diffusion gradient pulses and the RF refocusing pulses, and either be left as a pause or be filled with spoiler gradients in accordance with the invention.

In a preferred embodiment, after the aforesaid RF refocusing pulse, at least one further RF refocusing pulse or a restoration pulse is applied in the pulse sequence, which is preceded by a spoiler gradient pulse in each case and which is followed by a spoiler gradient pulse. Accordingly multiple refocusings, e.g. for a turbo spin echo experiment, or restorations are possible. In this case a diffusion gradient pulse is preferably not assigned to the said at least one further RF refocusing pulse. This preferred form of embodiment thus excludes double spin echo experiments.

Preferably the diffusion gradient pulses in the pulse sequence are designed so that, for the desired coherence path, they have an insignificant zero moment, e.g. for the spin echo or for the stimulated echo.

Generally the Nth moment Mn of a gradient coil train G(t) can be formulated to:

$$M_n(T) = \int_0^T G(t) t^n dt. \quad (7)$$

The zero moment follows from n=0 with $$M_0(T) = \int_0^T G(t) dt. \quad (8)$$

When considering a coherence path here, as a rule the time interval from the middle of the excitation pulse until the time of recording of the central K space row is considered.

The exact sequence of the diffusion gradient pulses can basically be selected as any given sequence. For any given gradient sequence and for each unwanted coherence path the implicit spoil moment as described above is able to be determined and used for the decision as to whether and to what extent spoiler gradient pulses are necessary. However the following configurations of diffusion gradient pulses are preferred.

The diffusion gradient pulses are applied before the RF refocusing pulse.
The diffusion gradient pulses are applied after the RF refocusing pulse.
A diffusion gradient pulse is applied before the RF refocusing pulse and an identical or a number of different diffusion gradient pulses after the RF refocusing pulse.
A diffusion gradient pulse is applied after the RF refocusing pulse and a number of different diffusion gradient pulses before the RF refocusing pulse.
A number of different diffusion gradient pulses are applied before and after the RF refocusing pulse.
Oscillating diffusion gradient pulses are applied before and after the RF refocusing pulse with the same or a different number or periods and/or frequencies and the same direction or different directions.
Pairs of diffusion gradient pulses are applied before and after the RF refocusing pulse with the same or different directions.

In another embodiment of the inventive method, the spoiler gradient pulses are applied separated in time from the diffusion gradient pulses. It is thus ensured that amplitude limitations of the gradient system are not exceeded. As an alternative, e.g. when the switching of spoiler gradient pulses is only necessary with very small amplitudes of the diffusion gradients, it can be of advantage to overlay spoiler gradient pulses and diffusion gradient pulses in time. In this way no additional time has to be kept for spoiler gradient pulses, and shorter echo times TE can be realized for example.

Especially preferred is an embodiment of the inventive method in which the pulse sequence is designed for a diffusion encoding with stimulated echoes.

BRIEF DESCRIPTION OF THE DRAWINGS

FIG. 4 shows a part of an example of a pulse sequence that can be produced by the inventive method,
FIG. 5 shows an alternate part of an example of a pulse sequence that can be produced by the inventive method.

DESCRIPTION OF THE PREFERRED EMBODIMENTS

Very simplified diagrams of pulse sequences are shown below. For better understanding of the invention the various pulses are shown as a function of the time t on a single time line. Normally in a pulse diagram of a gradient echo sequence the radio frequency pulses (the RF pulses HA, HR) to be emitted, as well as the gradient pulses GD, GS, are shown on different time axes lying above one another. Usually the RF pulses HA, HR are shown on one radio-frequency pulse time axis and the gradient pulses GD, GS on three gradient pulse time axes, which correspond to three spatial directions. The gradient pulses, spoiler gradient pulses GS and diffusion gradient pulses GD shown below can thus be shown in relation to their amplitudes distributed on the three gradient axes, and thus be oriented in space as per requirements. In such cases the spoiler gradient pulses GS do not have to be aligned absolutely identically to the diffusion gradient pulses GD, but such an alignment is part of a preferred form of embodiment.

In the following figures only elements significant for the invention or helpful for your understanding are depicted. Thus for example no slice selection gradients are shown, although they can certainly be present in the pulse sequence.

Figure 1:
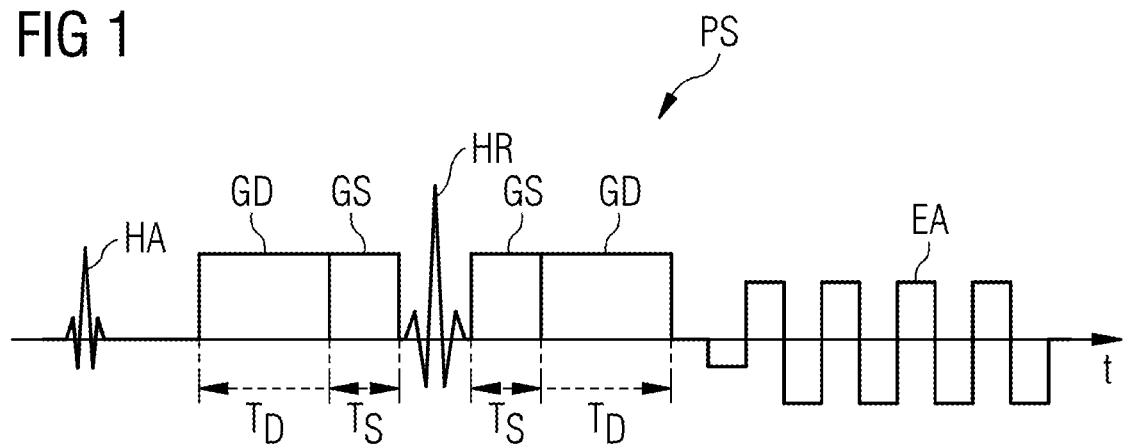
FIG. 1 shows an example of a pulse sequence that can be produced by the inventive method.

FIG. 1 shows an example of a pulse sequence PS, to which the inventive method can be applied. Time t runs from left to right in FIG. 1. Initially the pulse sequence PS comprises an RF excitation pulse HA with a duration usual for this type of pulse. The RF excitation pulse HA is followed by an RF refocusing pulse HR of usual duration, which is framed by diffusion gradient pulses GD and spoiler gradient pulses GS. In this example gradient pulses of the same type, i.e. the two diffusion gradient pulses GD and the two spoiler gradient pulses GS, each have the same polarity, the same amplitude and the same duration. The RF refocusing pulse HR forms a spin echo, which in the example shown is read out with an EPI echo read-out train EA, containing a number of read-out windows.

Figure 2:
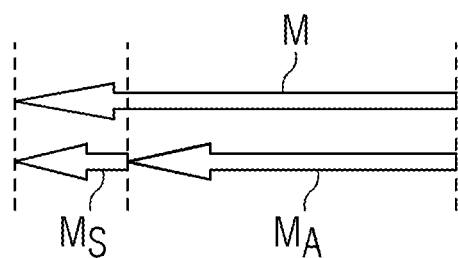
FIG. 2 shows a diagram of the relevant moments for the case in which $M_A$<M.

FIG. 1 shows the case in which the implicit spoil moment $M_A$ is smaller than the suppression moment M needed for suppression of coherences (see FIG. 2). Therefore it is necessary to apply the spoiler gradient pulses GS shown, which bring about a specific spoiler moment $M_S$. In the example shown the RF refocusing pulse HR is framed by two spoiler gradient pulses GS, which are applied with the spoiler application time $T_S$. The two spoiler gradient pulses GS in their turn are framed by two diffusion gradient pulses GD, which are applied for their part with the diffusion application time $T_D$.

The amplitude AS of the spoiler gradient pulses GS and their spoiler application time $T_S$ are produced from the established spoiler moment $M_S$. In an idealized case, in which the amplitude AS of the spoiler gradient pulses GS is predetermined as a constant by the type of construction of the apparatus, the spoiler application times $T_S$ would be produced in accordance with the formula $T_S = A_S/M_S$.

FIG. 2 depicts the relevant moments for the case in which the implicit spoil moment $M_A$ is smaller than the suppression moment M needed for suppression of coherences ($M_A < M$). In this case an additional spoiler moment $M_S$ is needed, which in this example is established from $M_S = M - M_A$. Such a spoiler moment $M_S$ can be introduced into the system via application of the spoiler gradient pulses GS shown in FIG. 1 with the spoiler application time $T_S$.

Figure 3:
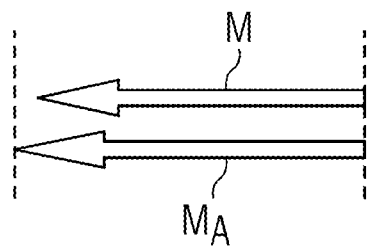
FIG. 3 shows a diagram of the relevant moments for the case in which $M_A$>M.

FIG. 3 depicts the relevant moments for the case in which the implicit spoil moment $M_A$ is greater than the suppression moment M needed for suppression of coherences M ($M_A > M$). In this case an additional spoiler moment $M_S$ is not needed. A corresponding part of a pulse sequence, which differs from that shown in FIG. 1, is shown in FIG. 4.

FIG. 4 shows an alternate pulse sequence PS based on that shown in FIG. 1 in the case in which the implicit spoil moment $M_A$ is greater than the suppression moment M needed for suppression of coherences M. In this case it is not necessary to apply spoiler gradient pulses GS, since an additional spoiler moment $M_S$ is not needed. In the example shown the RF refocusing pulse HR is therefore merely framed by two diffusion gradient pulses GD, which are each applied with the diffusion application time $T_D$. The diffusion gradient pulses DG shown here can have a fixed distance from the RF refocusing pulse HR. If necessary, this distance can be "filled" with spoiler gradient pulses.

FIG. 5 shows an alternate part of an example of a pulse sequence based on FIG. 1. The difference between the embodiment of FIG. 5 and the sequence shown in FIG. 1 is that the RF refocusing pulse HR shown in FIG. 1 comprises two RF refocusing pulses HRa here. This represents the case, for example, in which two 90° pulses rather than one 180° pulse are used as the refocusing pulse. No gradients are applied in this case between the two RF refocusing pulses HRa. They are viewed together as being representative of an RF refocusing pulse HR and are framed by diffusion gradient pulses GD and if necessary by spoiler gradient pulses GS.

Figure 6:
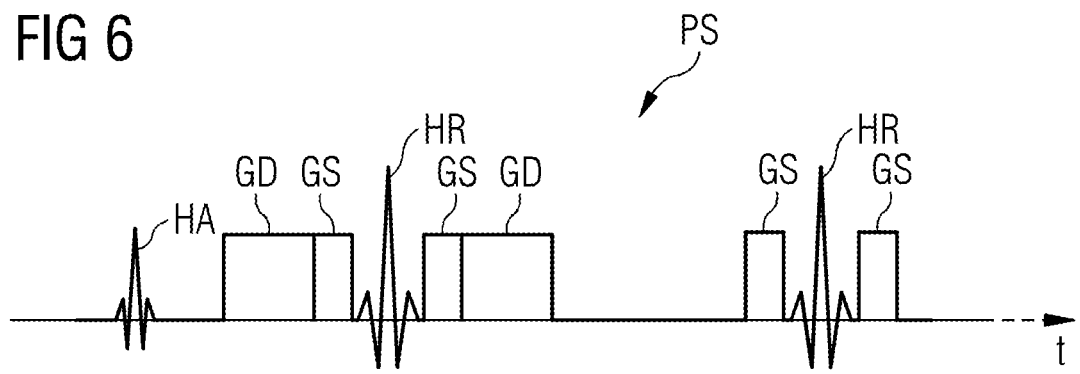
FIG. 6 shows a further part of an example of a pulse sequence that can be produced by the inventive method.

FIG. 6 shows a further part of an example of a pulse sequence, using FIG. 1 as its starting point. Here, by contrast with FIG. 1, a further RF refocusing pulse HR is applied, which for its part, is framed by two spoiler gradient pulses GS. These could be used for refocusing, e.g. for a repeated recording of data within the framework of a turbo spin echo recording (TSE) or of a gradient and spin echo recording (GRASE). Theoretically the application of further RF refocusing pulses HR would be possible in accordance with a corresponding scheme. Instead of the RF refocusing pulses HR shown here, a restoration pulse could also be applied to establish a longitudinal magnetization.

Figure 7:
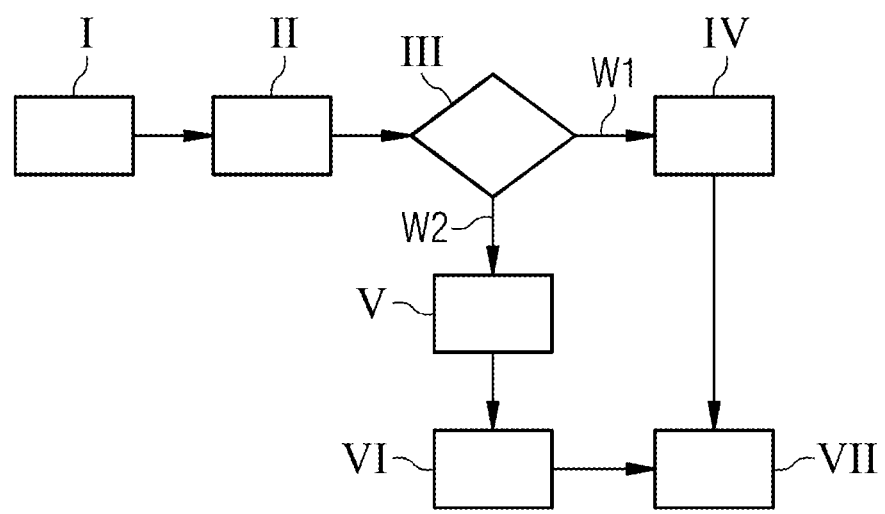
FIG. 7 shows a flowchart for the execution sequence of the inventive method.

FIG. 7 shows a flowchart for the execution sequence of the inventive method for control of a magnetic resonance tomography apparatus 1 (see FIG. 8) for diffusion imaging, in particular for showing the Intra-Voxel Incoherent Motion (IVIM). The block diagram in this case illustrates the most important method steps.

In step I the determination of an amplitude and an application time TD of a diffusion gradient pulse GD in conjunction with a predetermined diffusion encoding for a pulse sequence PS takes place and an implicit spoil moment $M_A$ resulting from the diffusion gradient pulse GD is determined from this. In an ideal case of a constant diffusion gradient pulse GD with negligible rise time, the implicit spoil moment $M_A$ would be calculated in accordance with $M_A = G_D \cdot T_D$.

In step II the determination of coherences that would occur during the measurement takes place and a suppression moment M need for suppression of these coherences is established (see e.g. formulas (2) or (3) above). For example, with a factor F and a constant read-out gradient moment $M_R$, the suppression moment would be calculated for $M = F \cdot M_R$.

In step III it is established whether the implicit spoil moment $M_A$ is greater or smaller than the suppression moment M. In the case of $M_A \geq M$, path W1 is selected for the further procedure, in the case $M_A < M$ path W1 is selected for the further procedure.

In step IV, for the case in which $M_A \geq M$, no additional spoiler moment $M_S$ is needed. Thus no spoiler gradient pulse GS is applied in the pulse sequence, or expressed in numerical terms, the amplitude of the spoiler gradient pulse of GS $A_S=0$ is set and/or the spoiler application time of $T_S=0$ is set.

In step V, for the case in which MA<M, an additional spoiler moment $M_S$ is established. It is calculated for example in accordance with $M_S = M - M_A$.

In step VI the spoiler amplitude $A_S$ and the necessary spoiler application time $T_S$ of the spoiler gradient pulses GS to be applied are calculated from the established spoiler moment $M_S$. In an ideal case of a constant spoiler gradient pulse GS with negligible rise time and a constant spoiler amplitude $A_S$ predetermined by the device, the spoiler application time $T_S$ would be calculated in accordance with $T_S = M_S/A_S$.

In step VII a pulse sequence PS consisting of RF excitation pulse HA, RF refocusing pulse HR, diffusion gradient pulses GD and the spoiler gradient pulses GS, provided the latter produce a spoiler moment >0, is created with the corresponding application times $T_S$, $T_D$ in each case and is used for controlling the image recording of a magnetic resonance tomography system.

Figure 8:
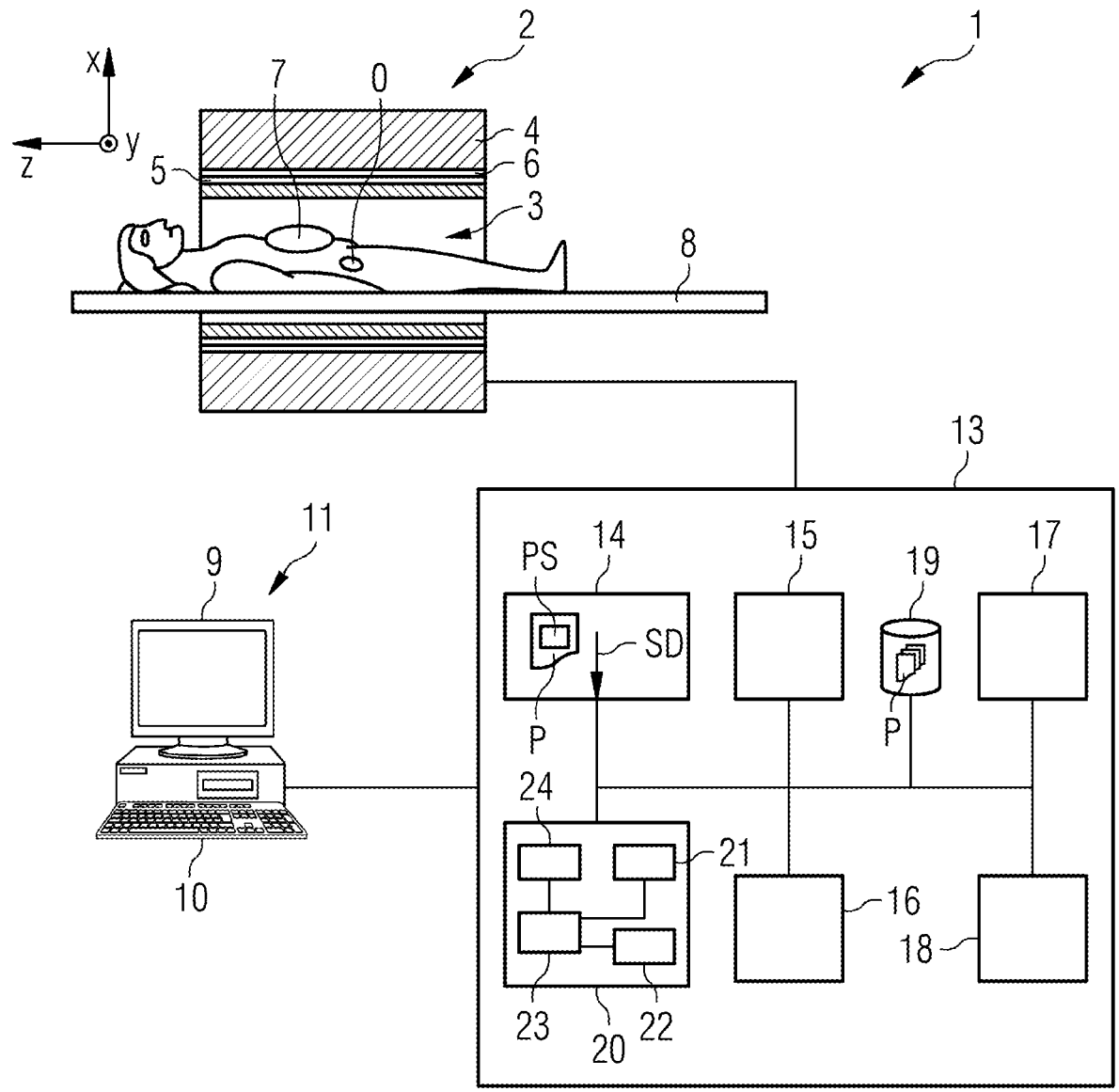
FIG. 8 shows a schematic diagram of a magnetic resonance tomography apparatus according to an exemplary embodiment of the invention.

FIG. 8 shows a schematic illustration of a magnetic resonance tomography apparatus 1. This includes the magnetic resonance scanner 2 with an examination space 3 or patient tunnel, in which a patient or test object, in the body of which the actual examination object O is located, is positioned on a couch 8. Although, in the example shown, the examination object O is imaged in the torso, diffusion tensor imaging is also often used for recordings of the brain, since it is particularly well suited for imaging of neurological structures.

The magnetic resonance scanner 2 is equipped in the usual way with a basic field magnet 4, a gradient coil arrangement 6 and an RF transmit antenna system 5 and an RF receive antenna system 7. In the exemplary embodiment shown, the RF transmit antenna system 5 is a whole body coil permanently built into the magnetic resonance scanner 2, while the RF receive antenna system 7 is composed of local coils arranged on the patient or test object (symbolized in FIG. 8 by just a single local coil). Basically, however, the whole body coil can also be used as an RF receive antenna system and the local coils as an RF transmit antenna system, provided these coils are able to be switched over into different operating modes in each case. The basic field magnet 4 here is embodied in the usual way so that it creates a basic magnetic field in the longitudinal direction of the patient, i.e. along the longitudinal axis running in the z-direction of the magnetic resonance scanner 2. In the usual way the gradient coil arrangement 6 has individually activatable gradient coils, in order to be able to switch gradients in the x-direction, y-direction, and the z-direction independently of one another. In addition the magnetic resonance scanner 2 contains shim coils (not shown), which can be embodied in the usual way.

The magnetic resonance tomography apparatus 1 shown in FIG. 8 involves a whole-body system with a patient tunnel, into which a patient can be introduced completely. However, the invention can also be used in other magnetic resonance tomography apparatuses, e.g. with a C-shaped housing open at the side. The only significant factor is that corresponding recordings of the examination object O can be produced.

The magnetic resonance tomography apparatus 1 further has a central control computer 13, for controlling the MR apparatus 1. This central control computer 13 has a sequence controller 14, with which the sequence of radio-frequency pulses (RF pulses) and gradient pulses is controlled as a function of a selected pulse sequence PS, or a sequence of a number of pulse sequences for recording a number of slices in a volume region of interest of the examination object is controlled within a measurement session. Such a pulse sequence PS can be predetermined and parameterized for example within a measurement or control protocol P. Usually different control protocols P for different measurements or measurement sessions are held in a memory 19 and can be selected by an operator (and if required changed if necessary) and then be used for carrying out the measurement. In the present case the control computer 13 contains pulse sequences for acquisition of the raw data.

To emit the individual RF pulses of a pulse sequence PS, the central control computer 13 has a radio-frequency transmit device 15, which creates the RF pulses, amplifies them and feeds them via a suitable interface (not shown in detail) into the RF transmit antenna system 5. For control of the gradient coils of the gradient coil arrangement 6, in order to switch the gradient pulses in an appropriate manner according to the predetermined pulse sequence PS, the control computer 13 has a gradient system interface 16. Via this gradient system interface 16 the diffusion gradient pulses and spoiler gradient pulses could be applied. The sequence controller 14 communicates in a suitable way, e.g. by sending out sequence control data SD, with the radio-frequency transmit device 15 and the gradient system interface 16 for carrying out the pulse sequence PS.

The control computer 13 also has a radio-frequency receive device 17 (likewise communicating in a suitable way with the sequence controller 14), in order to receive magnetic resonance signals within the read-out window predetermined by the pulse sequence PS coordinated by the RF receive antenna system 7 and in this way to acquire the raw data.

A reconstruction computer 18 accepts the acquired raw data here and reconstructs magnetic resonance image data from the acquired raw data. This reconstruction is also done as a rule on the basis of parameters that can be predetermined in the respective measurement or control protocol P. The image data can then be stored in a memory 19 for example.

The details of how suitable raw data can be acquired by the radiation of RF pulses and the switching of gradient pulses and how MR images or parameter maps can be reconstructed therefrom are basically known to those skilled in the art, and therefore need not be explained in more detail herein.

The spoiler gradient pulse adaptation processor 20 is in communication with other units for the exchange of data, in particular with the gradient system interface 16 and the sequence controller 14. As an alternative, it can be a part of the sequence controller 14. The spoiler gradient pulse adaptation processor 20 has a number of units for determining or establishing different values. A determination unit 21 is designed for determining an implicit spoil moment $M_A$ from a diffusion gradient pulse GD and its application time $T_D$. A determination unit 22 is designed for determining a suppression moment M for suppression of coherences, which would occur during a measurement. An establishment unit 23 is designed to establish a spoiler moment $M_S$ as a function of a comparison value and threshold value from the implicit spoiler moment $M_A$ and the suppression moment M, wherein, depending on whether this comparison value lies below or above the threshold value, different ways of calculation for the spoiler moment $M_S$ are applied. A determination unit 24 is designed for determination of a spoiler gradient pulse GS and its application time $T_S$ from the previously determined spoiler moment $M_S$.

The central control computer 13 can be operated via a terminal 11 with an input unit 10 and a display unit 9, via which the entire magnetic resonance tomography apparatus 1 can thus also be operated by an operator. Magnetic resonance tomography images can also be displayed on the display unit 9, and measurements can be planned and started and in particular control protocols P selected and if necessary modified by means of the input unit 10, if necessary in combination with the display unit 9

The inventive magnetic resonance tomography apparatus 1 and in particular the control computer 13 can also have a number of further components, not shown herein in detail, which are usually present in systems of this type, such as a network interface, in order to connect the entire system to a network and be able to exchange raw data and/or image data or parameter maps, but also further data, such as for example patient-relevant data or control protocols.

A wide diversity of measurement sequences, such as EPI measurement sequences or other measurement sequences for creation of diffusion-weighted images, are fundamentally known to those person skilled in the art.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method to control a magnetic resonance (MR) tomography apparatus for diffusion imaging, comprising:
   in a processor, determining coherences that occur during measurement of raw data in an execution of a diffusion imaging sequence by an MR scanner and, also in said processor, determining a suppression moment M needed for suppression of said coherences;
   in said processor, determining an amplitude $A_D$ and an application time $T_D$ of a predetermined diffusion gradient pulse GD in conjunction with a predetermined diffusion encoding produced by said diffusion imaging sequence, and determining an implicit spoil moment $M_A$ resulting from said diffusion gradient pulse GD;
   in said processor, establishing a spoiler moment $M_S$ as a function of a comparison value and a threshold value formed from the implicit spoil moment $M_A$ and the suppression M, and, depending on whether said comparison value is below or above said threshold value, applying different types of calculations for the spoiler $M_S$;
   in said processor, determining an amplitude $A_S$ of a spoiler gradient pulse and an application time $S_T$ of the spoiler gradient pulse GS from the determined spoiler moment $M_S$; and
   in said processor, generating a final form of said diffusion imaging sequence that comprises diffusion gradient pulses GD and spoiler gradient pulses GS with respective application times $T_D$ and $T_S$, and providing control signals from said processor to said MR scanner representing said final form of said diffusion imaging sequence and thereby operating said MR scanner so as to acquire raw data by execution of said final form or said diffusion imaging sequence.

2. A method as claimed in claim 1 comprising determining the suppression moment M from a readout gradient GR in said diffusion imaging sequence, and a known factor $F \geq 1$ using the formula:

$$M > F \int GR(t)dt.$$

3. A method as claimed in claim 1 comprising determining the suppression moment M from a known field of view FOV of said MR scanner, and from a known number of pixels PX per row of a diffusion image to be generated from said raw data, and a known factor $F \geq 1$, according to:

$$M = 2F \frac{PX\pi}{FOV\gamma}.$$

4. A method as claimed in claim 1 comprising determining the implicit spoil moment $M_A$ from a known diffusion gradient pulse having an amplitude $A_D$ and application time TD according to:

$$M_A = \int_0^{T_A} A_D(t)dt.$$

5. A method as claimed in claim 1 comprising determining the diffusion gradient pulses respectively on Cartesian axes x, y and z, with partial moments $MA_x$, $MA_y$, and $MA_z$, on the respective axes, according to:

$$M_A = \sqrt{\frac{1}{3}\left(M_{A_x}^2 + M_{A_y}^2 + M_{A_z}^2\right)}.$$

6. A method as claimed in claim 1 wherein each of said spoiler gradient pulses has an associated direction, and determining said spoiler gradient pulses GS in relation to the respective directions so as to support said implicit spoiler $M_A$ of the diffusion gradient pulses GD.

7. A method as claimed in claim 1 comprising determining said spoiler gradient pulses so as to be activated individually on a plurality of different physical gradient axes.

8. A method as claimed in claim 1 comprising determining said spoiler gradient pulses GS so as to be respectively activated along same axes as the diffusion gradient pulses GD.

9. A method as claimed in claim 1 comprising:
   determining said comparison value from the difference $M_D = M - M_A$, or from a value derived from $M_D$;
   determining said threshold to be reached if $M = M_A$ or $M_D = 0$;
   defining said spoiler moment MS, when $M_A < M$, as $M_D$ or said value derived from $M_D$; and
   setting the spoiler moment to zero if $M_A \geq M$.

10. A method as claimed in claim 1 comprising:
    starting from a time sequence of said gradient pulses, determining a threshold of a b value in said diffusion imaging sequence, with which an implicit spoil moment $M_A = M$ is achieved;
    in said processor, determining a current b value;
    if the current b value is below said threshold, setting said spoiler moment $M_S$ so as to suppress said coherences; and
    when said b value is above or at said threshold, setting said spoiler moment $M_S$ to be zero.

11. A method as claimed in claim 1 wherein said diffusion imaging sequence comprises a radio-frequency (RF) excitation pulse and an RF refocusing pulse, and producing said final form of said diffusion imaging sequence so that a spoiler gradient pulse GS is activated before said RF refocusing pulse and so that another spoiler gradient pulse GS is activated after said RF refocusing pulse.

12. A method as claimed in claim 11 comprising generating said final form of said diffusion imaging sequence so that at least one of a further RF refocusing pulse or a restoration pulse is activated after said RF refocusing pulse that is preceded and followed by respective spoiler gradient pulses GS, with said at least one further RF refocusing pulse not being assigned to any diffusion gradient pulse GD.

13. A method as claimed in claim 11 comprising:
generating said final form of said diffusion pulse sequence so that said diffusion gradient pulses GD are given an insignificant zero moment by one of:
   activating diffusion gradient pulses GD before said RF refocusing pulse and activating further diffusion gradient pulses GD after said RF refocusing pulse that are the same as the diffusion gradient pulses GD activated before the RF refocusing pulse;
   activating diffusion gradient pulses GD before said RF refocusing pulse and activating further diffusion gradient pulses GD after said RF refocusing pulse that are different from the diffusion gradient pulses GD that were activated before said RF refocusing pulse;
   activating oscillating diffusion gradient pulses before said RF refocusing pulse and activating further oscillating diffusion gradient pulses after said RF refocusing pulses that have a same number of periods as the oscillating diffusion gradient pulses activated before said RF refocusing pulse;
   activating oscillating diffusion gradient pulses before said RF refocusing pulse and activating further oscillating diffusion gradient pulses after said RF refocusing pulse that have a different number of periods from the oscillating diffusion gradient pulses GD activated before the RF refocusing pulse;
   activating pairs of diffusion gradient pulses GD before said RF refocusing pulse and activating further pairs of diffusion gradient pulses after said RF refocusing pulse, with said further pairs of diffusion gradient pulses GD being in the same directions as the pairs of diffusion gradient pulses GD activated before the RF refocusing pulse; and
   activating pairs of diffusion gradient pulses before said RF refocusing pulse and activating further pairs of diffusion gradient pulses after said RF refocusing pulse, with the further pairs of diffusion gradient pulses having different directions from the pairs of diffusion gradient pulses activated before the RF refocusing pulse.

14. A method as claimed in claim 1 comprising generating said final form of said diffusion imaging sequence with said spoiler gradient pulses GS activated separated in time from said diffusion gradient pulses GD.

15. A method as claimed in claim 1 comprising generating said final form of said diffusion imaging sequence with said spoiler gradient pulses GS activated overlapping in time from said diffusion gradient pulses GD.

16. A computer to control a magnetic resonance (MR) tomography apparatus for diffusion imaging, said computer comprising:
a spoiler gradient pulse adaptation processor configured to determine coherences that occur during measurement of raw data in an execution of a diffusion imaging sequence by an MR scanner and also to determine a suppression moment M needed for suppression of said coherences;
said spoiler gradient pulse adaptation processor being configured to determine an amplitude $A_D$ and an application time $T_D$ of a predetermined diffusion gradient pulse GD in conjunction with a predetermined diffusion encoding produced by said diffusion imaging sequence, and to determine an implicit spoil moment $M_A$ resulting from said diffusion gradient pulse GD;
said spoiler gradient pulse adaptation processor being configured to establish a spoiler moment $M_S$ as a function of a comparison value and a threshold value formed from the implicit spoil moment $M_A$ and the suppression M, and, depending on whether said comparison value is below or above said threshold value, to apply different types of calculations for the spoiler $M_S$;
said spoiler gradient pulse adaptation processor being configured to determine an amplitude $A_S$ of a spoiler gradient pulse and an application time $S_T$ of the spoiler gradient pulse GS from the determined spoiler moment $M_S$;
said spoiler gradient pulse adaptation processor being configured to generate a final form of said diffusion imaging sequence that comprises diffusion gradient pulses GD and spoiler gradient pulses GS with respective application times $T_D$ and $T_S$; and
an output interface configured to provide control signals from said spoiler gradient pulse adaptation processor to said MR scanner representing said final form of said diffusion imaging sequence and thereby to operate said MR scanner so as to acquire raw data by execution of said final form or said diffusion imaging sequence.

17. A magnetic resonance (MR) tomography apparatus comprising:
an MR scanner;
a spoiler gradient pulse adaptation processor configured to determine coherences that occur during measurement of raw data in an execution of a diffusion imaging sequence by an MR scanner and also to determine a suppression moment M needed for suppression of said coherences;
said spoiler gradient pulse adaptation processor being configured to determine an amplitude $A_D$ and an application time $T_D$ of a predetermined diffusion gradient pulse GD in conjunction with a predetermined diffusion encoding produced by said diffusion imaging sequence, and to determine an implicit spoil moment $M_A$ resulting from said diffusion gradient pulse GD;
said spoiler gradient pulse adaptation processor being configured to establish a spoiler moment $M_S$ as a function of a comparison value and a threshold value formed from the implicit spoil moment $M_A$ and the suppression M, and, depending on whether said comparison value is below or above said threshold value, to apply different types of calculations for the spoiler $M_S$;
said spoiler gradient pulse adaptation processor being configured to determine an amplitude $A_S$ of a spoiler gradient pulse and an application time $S_T$ of the spoiler gradient pulse GS from the determined spoiler moment $M_S$;
said spoiler gradient pulse adaptation processor being configured to generate a final form of said diffusion imaging sequence that comprises diffusion gradient pulses GD and spoiler gradient pulses GS with respective application times $T_D$ and $T_S$; and
an output interface configured to provide control signals from said spoiler gradient pulse adaptation processor to said MR scanner representing said final form of said diffusion imaging sequence and thereby to operate said MR scanner so as to acquire raw data by execution of said final form or said diffusion imaging sequence.

18. A non-transitory, computer-readable data storage medium encoded with programming instructions, said storage medium being loaded into a computer of a magnetic resonance (MR) tomography apparatus comprising an MR scanner, and said programming instructions causing said computer to:

determine coherences that occur during measurement of raw data in an execution of a diffusion imaging sequence by an MR scanner, and determine a suppression moment M needed for suppression of said coherences;

determine an amplitude $A_D$ and an application time $T_D$ of a predetermined diffusion gradient pulse GD in conjunction with a predetermined diffusion encoding produced by said diffusion imaging sequence, and determine an implicit spoil moment $M_A$ resulting from said diffusion gradient pulse GD;

establish a spoiler moment $M_S$ as a function of a comparison value and a threshold value formed from the implicit spoil moment $M_A$ and the suppression M, and, depending on whether said comparison value is below or above said threshold value, apply different types of calculations for the spoiler $M_S$;

determine an amplitude $A_S$ of a spoiler gradient pulse and an application time $S_T$ of the spoiler gradient pulse GS from the determined spoiler moment $M_S$; and generate a final form of said diffusion imaging sequence that comprises diffusion gradient pulses GD and spoiler gradient pulses GS with respective application times $T_D$ and $T_S$, and provide control signals to said MR scanner representing said final form of said diffusion imaging sequence, and thereby operate said MR scanner so as to acquire raw data by execution of said final form or said diffusion imaging sequence.

* * * * *